United States Patent
Gerhard et al.

(10) Patent No.: US 9,972,967 B2
(45) Date of Patent: May 15, 2018

(54) METHOD OF PRODUCING A LASER CHIP

(71) Applicant: OSRAM Opto Semiconductors GmbH, Regensburg (DE)

(72) Inventors: Sven Gerhard, Alteglofsheim (DE); Alfred Lell, Maxhütte-Haidhof (DE); Joachim Pfeiffer, Obertraubling (DE); Jens Mueller, Regensburg (DE); Christoph Eichler, Donaustauf (DE); Thomas Veit, Mintraching (DE); Thomas Adlhoch, Brennberg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days. days.

(21) Appl. No.: 15/509,028

(22) PCT Filed: Aug. 27, 2015

(86) PCT No.: PCT/EP2015/069698
§ 371 (c)(1),
(2) Date: Mar. 6, 2017

(87) PCT Pub. No.: WO2016/037863
PCT Pub. Date: Mar. 17, 2016

(65) Prior Publication Data
US 2017/0264073 A1    Sep. 14, 2017

(30) Foreign Application Priority Data
Sep. 8, 2014    (DE) .......................... 10 2014 112 902

(51) Int. Cl.
*H01S 5/02* (2006.01)
*H01S 5/22* (2006.01)

(52) U.S. Cl.
CPC .......... *H01S 5/0202* (2013.01); *H01S 5/0203* (2013.01); *H01S 5/22* (2013.01)

(58) Field of Classification Search
CPC ............................ H01S 5/0202; H01S 5/0203
See application file for complete search history.

(56) References Cited

U.S. PATENT DOCUMENTS

| | | | |
|---|---|---|---|
| 2009/0137098 A1 | 5/2009 | Sakamoto et al. | |
| 2009/0185594 A1 | 7/2009 | Hiroyama et al. | |

(Continued)

FOREIGN PATENT DOCUMENTS

| | | |
|---|---|---|
| JP | 2003-017791 | 1/2003 |
| JP | 2012-243866 A | 12/2012 |

(Continued)

OTHER PUBLICATIONS

German Search Report dated Apr. 27, 2015 in corresponding German Application No. 10 2014 112 902.4.

(Continued)

*Primary Examiner* — Errol Fernandes
(74) *Attorney, Agent, or Firm* — DLA Piper LLP (US)

(57) ABSTRACT

A method of producing a laser chip includes providing a semiconductor wafer; creating a plurality of depressions arranged one behind another along a breaking direction on a top side of the semiconductor wafer, wherein 1) each depression includes a front boundary face and a rear boundary face successively in the breaking direction, 2) in at least one depression, the rear boundary face is inclined by an angle of 95° to 170° relative to the top side of the semiconductor wafer, 3) at least one depression includes a shoulder adjacent to the rear boundary face, and 4) the shoulder includes a shoulder face parallel to the top side of the semiconductor wafer and adjacent to the rear boundary face; and breaking the semiconductor wafer in the breaking direction at a breaking plane oriented perpendicularly to the top side of the semiconductor wafer and which runs through the depressions.

15 Claims, 4 Drawing Sheets

(56) References Cited

U.S. PATENT DOCUMENTS

| | | |
|---|---|---|
| 2009/0262771 A1 | 10/2009 | Inoue et al. |
| 2010/0301348 A1 | 12/2010 | Kamikawa et al. |
| 2011/0292956 A1 | 12/2011 | Takagi et al. |
| 2011/0292959 A1 | 12/2011 | Shimamoto et al. |
| 2013/0142209 A1 | 6/2013 | Tanisaka et al. |

FOREIGN PATENT DOCUMENTS

| | | |
|---|---|---|
| JP | 2013-118250 | 6/2013 |
| WO | 2012-113648 | 8/2012 |

OTHER PUBLICATIONS

Notice of Reasons for Rejection dated Jan. 30, 2018, of corresponding Japanese Application No. 2017-513105 in English.

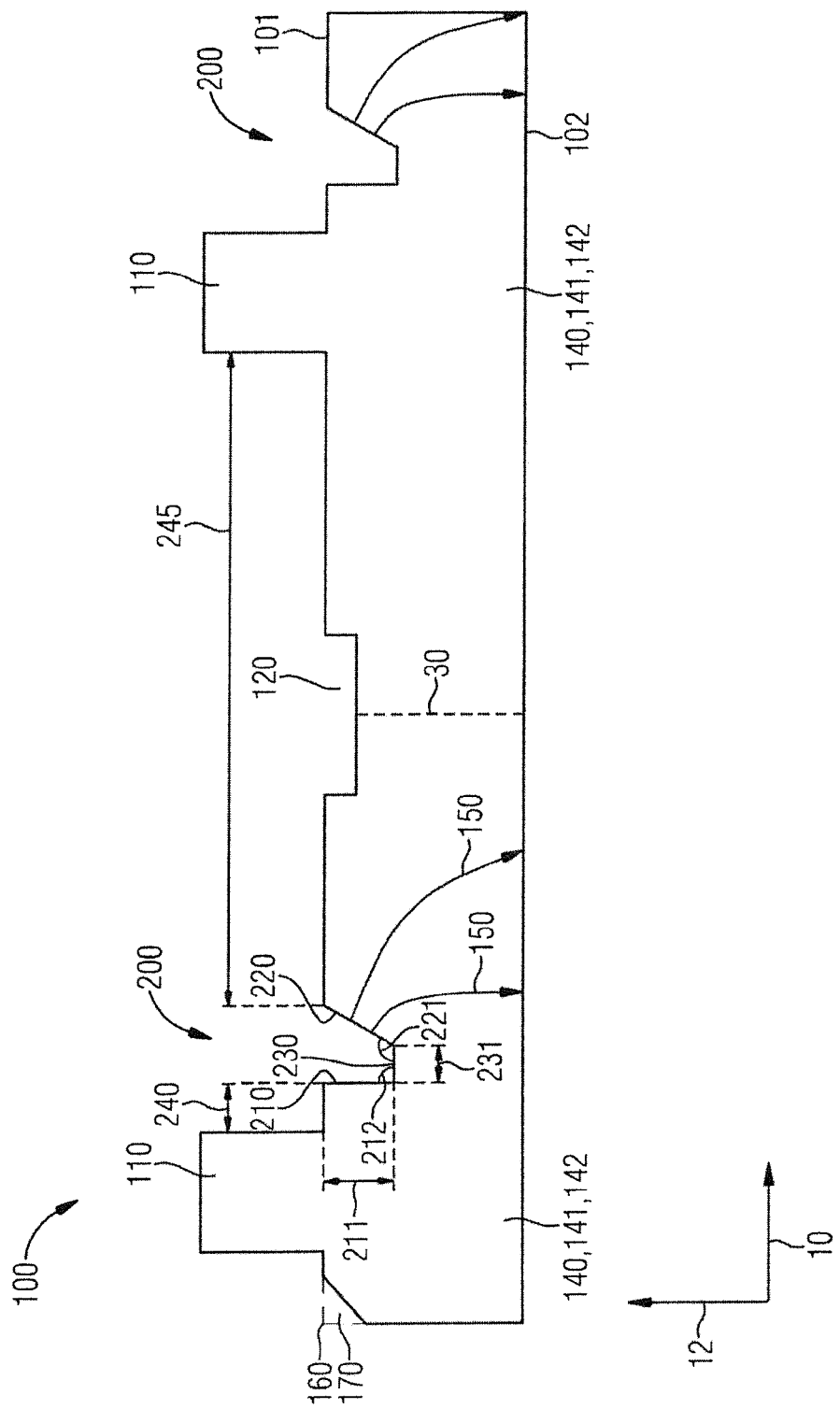

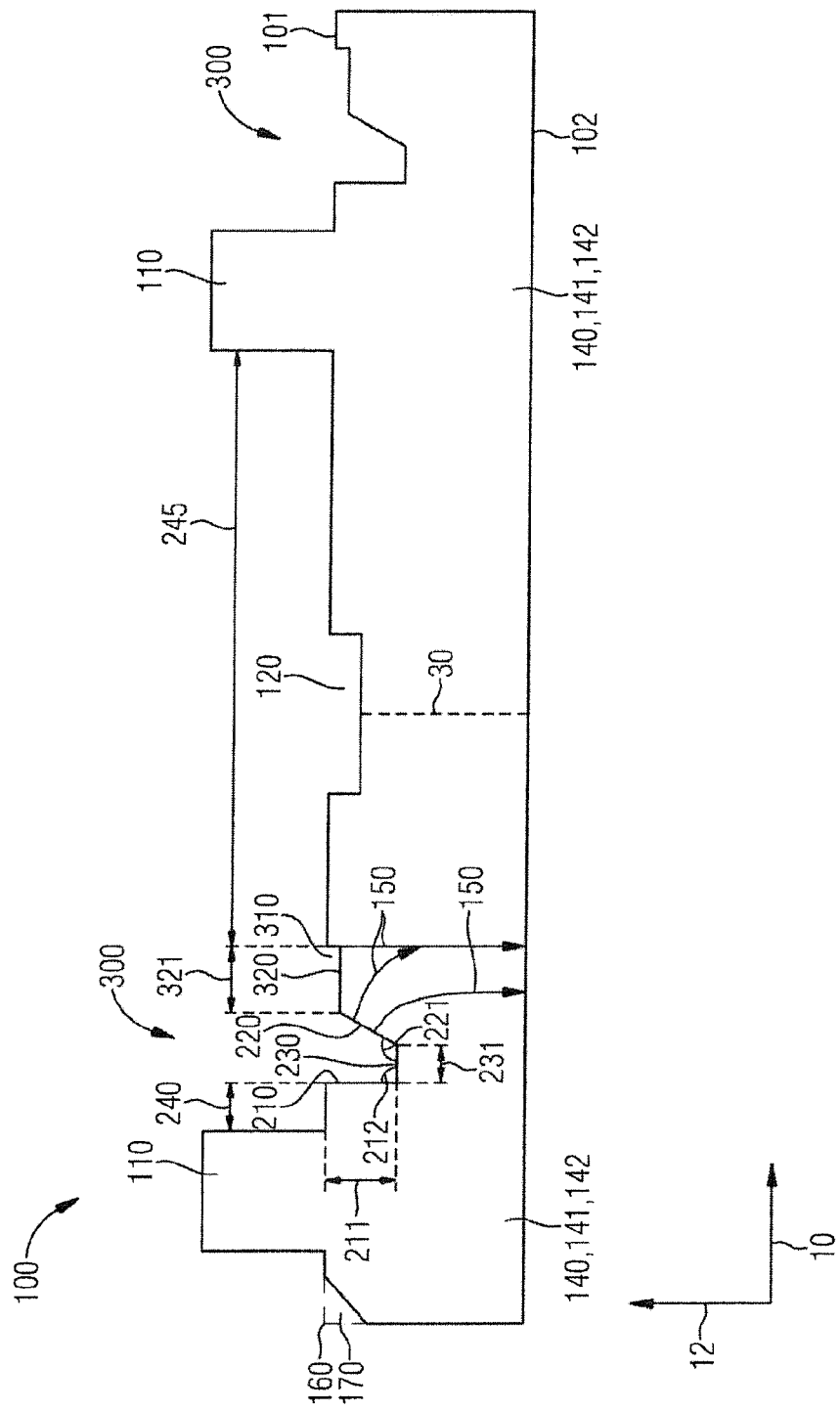

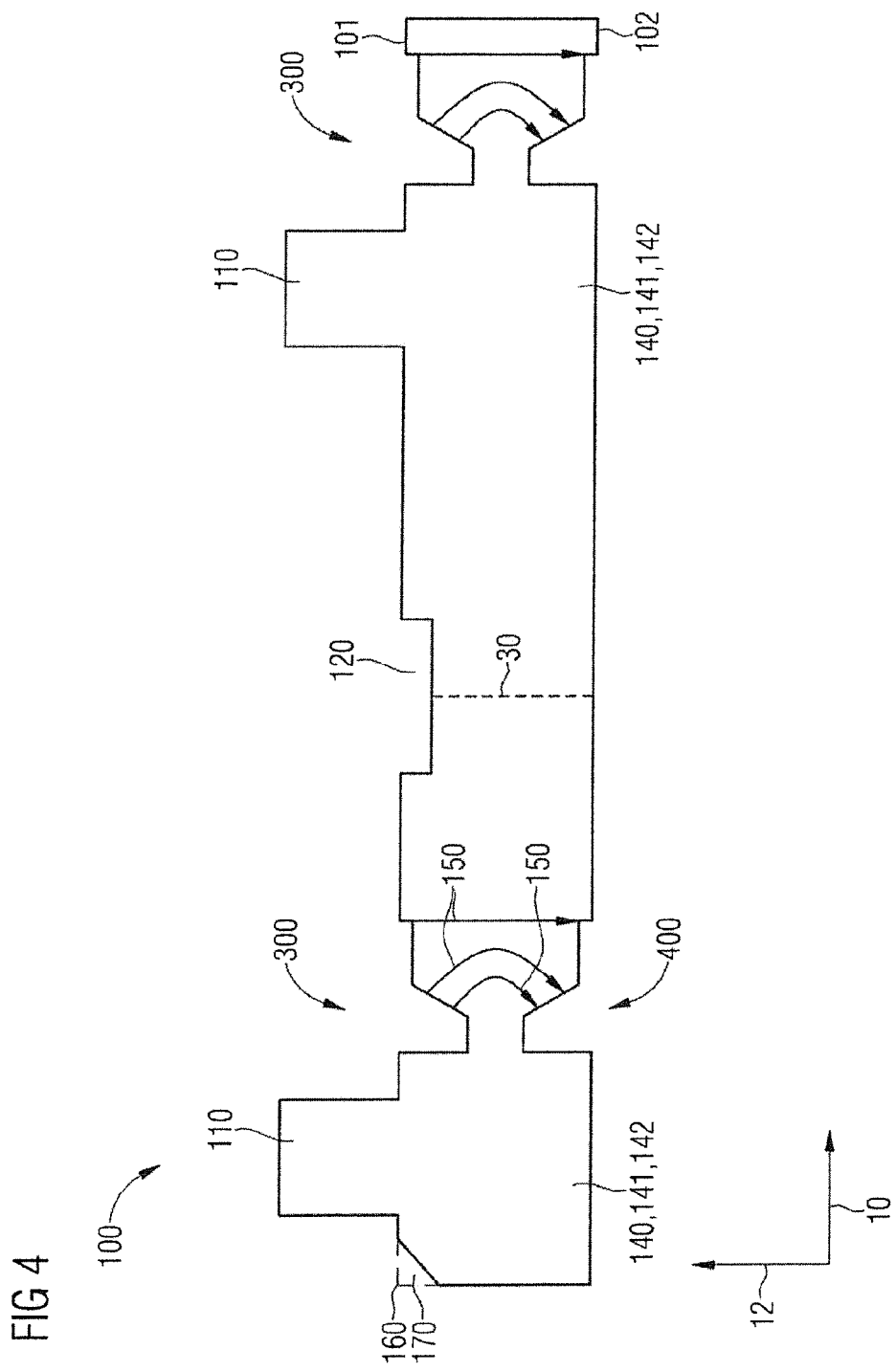

METHOD OF PRODUCING A LASER CHIP

TECHNICAL FIELD

This disclosure relates to a method of producing a laser chip.

BACKGROUND

Semiconductor laser chips comprising integrated laser diodes are known. It is known to produce a plurality of such laser chips simultaneously in common word processes by a procedure in which a plurality of laser diode structures are formed in a regular matrix arrangement in an extensive semiconductor wafer and are singulated by dividing the semiconductor wafer only after conclusion of the processing process. The semiconductor wafer is divided by controlled breaking of the semiconductor wafer. Two mutually opposite breaking faces of the laser chips formed in this way each form mirror facets of the laser chips.

To define the breaking planes along which the semiconductor wafer is broken, it is known to create depressions (skips) on the surface of the semiconductor wafer before the semiconductor wafer is broken. However, it has been found that during the breaking of the semiconductor wafer, proceeding from the depressions, dislocations and other crystal imperfections may spread in the crystal of the semiconductor wafer and they may extend right into active regions of the laser diode structures and reduce the quality of the resulting mirror facets. This may result in increased threshold currents, a reduced slope, faults in the imaging quality, a reduced efficiency and a reduced component lifetime.

SUMMARY

We provide a method of producing a laser chip including providing a semiconductor wafer including a top side and an underside, wherein the semiconductor wafer includes a plurality of integrated laser diode structures arranged one behind another along a defined breaking direction; creating a plurality of depressions arranged one behind another along the breaking direction on the top side of the semiconductor wafer, wherein 1) each depression includes a front boundary face and a rear boundary face successively in the breaking direction, 2) in at least one depression, the rear boundary face is inclined by an angle of 95° to 170° relative to the top side of the semiconductor wafer, 3) at least one depression includes a shoulder adjacent to the rear boundary face, and 4) the shoulder includes a shoulder face parallel to the top side of the semiconductor wafer and adjacent to the rear boundary face; and breaking the semiconductor wafer in the breaking direction at a breaking plane oriented perpendicularly to the top side of the semiconductor wafer and which runs through the depressions.

We also provide a method of producing a laser chip including providing a semiconductor wafer including a top side and an underside, wherein the semiconductor wafer includes a plurality of integrated laser diode structures arranged one behind another along a defined breaking direction; creating a plurality of depressions arranged one behind another along the breaking direction on the top side of the semiconductor wafer, wherein 1) each depression includes a front boundary face and a rear boundary face successively in the breaking direction, 2) in at least one depression, the rear boundary face is inclined by an angle of 95° to 170° relative to the tope side of the semiconductor wafer, 3) at least one depression includes a shoulder adjacent to the rear boundary face, and 4) the shoulder includes a shoulder face parallel to the top side of the semiconductor wafer and adjacent to the rear boundary face; creating a trench running in the breaking direction and arranged in a breaking plane on the underside of the semiconductor wafer, wherein the breaking plane is oriented perpendicularly to the top side of the semiconductor wafer and runs through the depressions; and breaking the semiconductor wafer in the breaking direction at the breaking plane.

BRIEF DESCRIPTION OF THE DRAWINGS

FIG. 2 shows a schematic sectional illustration of the semiconductor wafer with first upper depressions.

FIG. 3 shows a schematic sectional illustration of the semiconductor wafer with second upper depressions.

FIG. 4 shows a schematic sectional illustration of the semiconductor wafer with additional lower depressions.

LIST OF REFERENCE SIGNS

Figure 1:
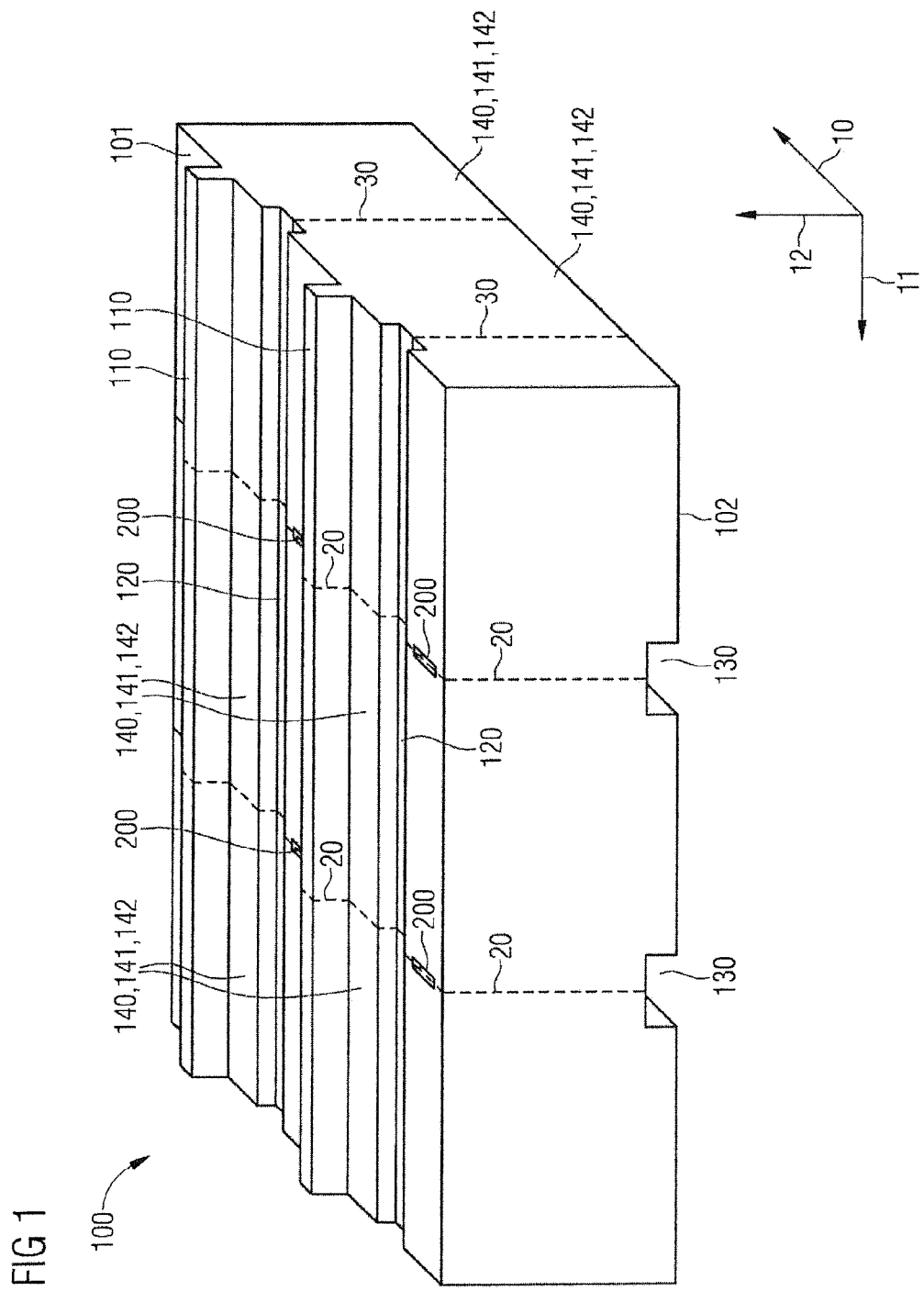
FIG. 1 shows a schematic perspective view of a part of a semiconductor wafer.

10 Breaking direction
11 Longitudinal direction
12 Growth direction
20 Breaking plane
30 Further breaking plane
100 Semiconductor wafer
101 Top side
102 Underside
110 Rear
120 Mesa trench
130 Lower trench
140 Laser chip
141 Laser diode structure
142 Resonator
150 Crystal imperfection
160 Front edge
170 Edge notch
200 First upper depressions
210 Front boundary face
211 Depth
212 Front angle
220 Rear boundary face
221 Rear angle
230 Bottom face
231 Length
240 Front distance
241 Rear distance
300 Second upper depressions
310 Shoulder
320 Shoulder face
321 Length
400 Lower depression

DETAILED DESCRIPTION

A method of producing a laser chip comprises steps to provide a semiconductor wafer comprising a top side and an underside, wherein the semiconductor wafer comprises a plurality of integrated laser diode structures arranged one behind another along a defined breaking direction; to create a plurality of depressions arranged one behind another along the breaking direction on the top side of the semiconductor wafer, wherein each depression comprises a front boundary face and a rear boundary face successively in the breaking direction, wherein, in at least one depression, the rear boundary face is inclined by an angle of 95° to 170° relative to the top side of the semiconductor wafer, wherein at least one depression comprises a shoulder adjacent to the rear boundary face, wherein the shoulder comprises a shoulder face parallel to the top side of the semiconductor wafer and adjacent to the rear boundary face, and break the semiconductor wafer in the breaking direction at a breaking plane oriented perpendicularly to the top side of the semiconductor wafer and which runs through the depressions.

Advantageously, the rear boundary face of the at least one depression of the depressions arranged on the top side of the semiconductor wafer, the rear boundary face being inclined by an angle relative to the top side of the semiconductor wafer, in this method has the effect that dislocations and other crystal imperfections proceeding from the rear boundary face of the depression propagate in the crystal of the semiconductor wafer toward the underside of the semiconductor wafer and, as a result, may not penetrate into a region of the semiconductor wafer that is critical for the quality of the laser chip obtainable by the method. This advantageously reduces a risk of impairment of the properties of the laser chip obtainable by the method by crystal imperfections formed during the breaking of the semiconductor wafer.

It is preferred for the rear boundary faces of as many as possible or even all of the depressions arranged one behind another on the top side of the semiconductor wafer to be inclined by an angle of 95° to 170° relative to the top side of the semiconductor wafer. What may be achieved as a result is that, in all correspondingly formed depressions on the top side of the semiconductor wafer, the risk of formation of crystal imperfections that propagate into critical regions of the semiconductor wafer is reduced.

A respective depression may be arranged between two adjacent laser diode structures. We found that a reliable definition of the breaking plane at which the semiconductor wafer is broken is possible as a result, without the semiconductor wafer being excessively damaged in the process by an excessively high number of depressions.

At least one depression may be arranged closer to a laser diode structure located closest upstream of the depression in the breaking direction than to a laser diode structure located closest downstream of the depression in the breaking direction. This means that the distance between the laser diode structure located closest upstream of the depression in the breaking direction and the depression is smaller than the distance between the depression and the laser diode structure located closest downstream of the depression in the breaking direction. As a result, for crystal imperfections proceeding from the rear boundary face of the depression, advantageously enough space remains for them to emerge in the direction of the underside of the semiconductor wafer into a substrate of the semiconductor wafer without penetrating into a region of the semiconductor wafer that is critical for the quality of the laser diode structure located closest downstream of the depression in the breaking direction. This advantageously decreases the risk that the laser diode structure located closest downstream of the depression in the breaking direction will be damaged by crystal imperfections proceeding from the depression during breaking of the semiconductor wafer.

Preferably, a plurality of depressions or even all depressions on the top side of the semiconductor wafer are arranged correspondingly closer to the laser diode structure located closest upstream of the respective depression in each case in the breaking direction than to the laser diode structure located closest downstream of the respective depression in the breaking direction.

The distance between the depression and the laser diode structure located closest downstream of the depression in the breaking direction may be at least four times the magnitude of the distance between the depression and the laser diode structure located closest upstream of the depression in the breaking direction, preferably even at least eight times the magnitude thereof. Advantageously, we found that such a large distance between the depression and the laser diode structure located closest downstream of the depression in the breaking direction may bring about an effective reduction of a risk of damage to the laser diode structure located closest downstream of the depression as a result of crystal imperfections proceeding from the rear boundary face of the depression during the breaking of the semiconductor wafer.

Each of the laser diode structures may comprise a resonator oriented perpendicularly to the breaking direction. As a result, mirror facets or laser facets of the laser chips singulated in this way are formed during breaking of the semiconductor wafer at the breaking plane. The facets may advantageously have a high quality. As a result of the configuration of the depression arranged on the top side of the semiconductor wafer and comprising the rear boundary face inclined by an angle relative to the top side of the semiconductor wafer, there is only a small risk that the facets will be damaged by crystal imperfections proceeding from the depression during breaking of the semiconductor wafer.

The depressions may be created by scribing or by a laser. Advantageously, both methods enable a precise control of the resulting form of the depressions, in particular a precise control over the inclination of the rear boundary face of the depression.

The method may comprise a further step of creating an edge notch arranged in the breaking plane on an edge of the semiconductor wafer located at the front in the breaking direction. Advantageously, the edge notch may serve, during breaking of the semiconductor wafer, as a starting point for the break propagating through the semiconductor wafer along the breaking plane in the breaking direction. The edge notch may, for example, likewise be created by scribing or by a laser.

The method may comprise a further step of creating a trench running in the breaking direction and arranged in the breaking plane on the underside of the semiconductor wafer. Advantageously, creating the trench on the underside of the semiconductor wafer may facilitate breaking of the semiconductor wafer.

The trench may be created by sawing, a laser or an etching process. These methods advantageously allow the trench to be created precisely, cost-effectively and rapidly.

The method may comprise a further step of creating a plurality of depressions arranged one behind another in the breaking plane and along the breaking direction on the underside of the semiconductor wafer. Advantageously, such depressions arranged on the underside of the semiconductor wafer may also facilitate breaking the semiconductor wafer at the breaking plane.

The depressions on the underside of the semiconductor wafer may be formed in a mirror-inverted fashion with respect to the depressions on the top side of the semiconductor wafer. This means that, in at least one depression, but preferably in many or even all of the depressions on the underside of the semiconductor wafer, a rear boundary face in the breaking direction is inclined by an angle of 95° to 170° relative to the underside of the semiconductor wafer.

This has the consequence that crystal imperfections proceeding from the rear boundary face of a depression formed in this way on the underside of the semiconductor wafer may run through the semiconductor wafer substantially in a direction perpendicular to the underside of the semiconductor wafer and in the process may intercept crystal imperfections proceeding from a depression arranged on the top side of the semiconductor wafer. In this case, the depressions arranged on the underside of the semiconductor wafer may be arranged in the breaking direction exactly below the depressions arranged on the top side of the semiconductor wafer. However, the depressions arranged on the top side of the semiconductor wafer and the depressions arranged on the underside of the semiconductor wafer may also be offset relative to one another in the breaking direction.

In at least one depression, the rear boundary face may be inclined by an angle of 100° to 160°, preferably by an angle of 120° to 145°, relative to the top side of the semiconductor wafer. Experiments have shown that such an inclination of the rear boundary face relative to the top side of the semiconductor wafer makes it possible to achieve a particularly effective diversion of crystal imperfections proceeding from the rear boundary face of the depression in the direction toward the underside of the semiconductor wafer.

At least one depression may comprise a depth of 5 μm to 80 μm, preferably of 15 μm to 70 μm, particularly preferably 25 μm to 55 μm, in a direction perpendicularly to the top side of the semiconductor wafer. Preferably, a plurality of depressions or all depressions on the top side of the semiconductor wafer are formed in this way. Experiments have shown that depressions of this depth make it possible to achieve a particularly effective definition of the breaking plane without an excessively high level of damage to the crystal of the semiconductor wafer being brought about by creating the depression.

In at least one depression, the front boundary face may be inclined by an angle of 75° to 95°, preferably by an angle of 85° to 95°, relative to the top side of the semiconductor wafer. This means that the front boundary face of the depression is arranged substantially perpendicularly to the top side of the semiconductor wafer. Preferably, a plurality of depressions or all depressions on the top side of the semiconductor wafer are formed in this way. We found that, during breaking of the semiconductor wafer, substantially no crystal imperfections proceed from the front boundary faces of the depressions, and so they do not have to be inclined relative to the top side of the semiconductor wafer. The substantially perpendicular arrangement of the front boundary faces relative to the top side of the semiconductor wafer may advantageously be produced particularly simply and cost-effectively.

At least one depression may comprise a length of 5 μm to 100 μm, preferably of 15 μm to 80 μm, particularly preferably of 20 μm to 50 μm, at its base in the breaking direction. Preferably, a plurality of depressions or even all depressions on the top side of the semiconductor wafer are formed in this way. Experiments have shown that, by creating depressions of this length on the top side of the semiconductor wafer, the breaking plane for breaking the semiconductor wafer may be defined particularly effectively without creating the depressions being accompanied by an excessively high level of damage to the crystal structure of the semiconductor wafer.

At least one depression comprises a shoulder adjacent to the rear boundary face. In this case, the shoulder comprises a shoulder face parallel to the top side of the semiconductor wafer and adjacent to the rear boundary face. Preferably, a plurality of depressions or even all depressions on the top side of the semiconductor wafer are formed in this way. During breaking of the semiconductor wafer at the breaking plane, crystal imperfections may proceed from the shoulder face of the shoulder of the depression, the crystal imperfections propagating through the crystal of the semiconductor wafer substantially perpendicularly to the shoulder face, that is to say also perpendicularly to the top side of the semiconductor wafer. The crystal imperfections proceeding from the shoulder face thus propagate in the direction toward the underside of the semiconductor wafer without penetrating into regions of the semiconductor wafer that are critical for the quality of the laser chip obtainable by the method. Rather, crystal imperfections proceeding from the shoulder face of the shoulder of the depression may still intercept crystal imperfections proceeding from the rear boundary face of the depression, as a result of which the risk of penetration of crystal imperfections proceeding from the rear boundary face of the depression into regions of the semiconductor wafer critical for the quality of the laser chip obtainable by the method is additionally reduced.

The shoulder face may comprise a length of 5 μm to 100 μm, preferably a length of 15 μm to 80 μm, particularly preferably a length of 20 μm to 50 μm, in the breaking direction. We found that forming the shoulder face of such a length is particularly effective.

The above-described properties, features and advantages and the way in which they are achieved will become clearer and more clearly understood in association with the following description of examples explained in greater detail in association with the drawings.

FIG. 1 shows a schematic perspective illustration of a part of a semiconductor wafer 100. The semiconductor wafer 100 is formed as a substantially flat wafer comprising a top side 101 and an underside 102 opposite the top side 101. The semiconductor wafer 100 may comprise a plurality of different layers grown epitaxially one on top of another in a growth direction 12 extending from the underside 102 to the top side 101 of the semiconductor wafer 100. The semiconductor wafer 100 may comprise larger dimensions in a lateral direction compared to the illustration in FIG. 1. The semiconductor wafer 100 may be formed, for example, by a complete wafer or a part of a wafer.

A plurality of laser chips 140 are intended to be formed from the semiconductor wafer 100 by dividing the semiconductor wafer 100. For this purpose, the semiconductor wafer 100 comprises a plurality of integrated laser diode structures 141. The individual laser diode structures 141 are arranged in series which are arranged alongside one another in a breaking direction 10 of the semiconductor wafer 100, the breaking direction being perpendicular to the growth direction 12, and extend in a longitudinal direction 11 perpendicular to the breaking direction 10 and to the growth direction 12.

Each of the series of laser diode structures 141 comprises a rib 110 extending in the longitudinal direction 11 on the top side 101 of the semiconductor wafer 100. The ribs 110 may also be referred to as ridges. The ribs 110 are formed by parts of the semiconductor wafer 100 having been removed on the top side 101 of the semiconductor wafer 100 in the regions outside the ribs 110, for example, by an etching process. In this case, the part of the semiconductor wafer 100 removed on the top side 101 of the semiconductor wafer 100 may comprise, for example, an upper cladding layer as a result of which the upper cladding layer remains only in the region of the ribs 110. The ribs 110 may comprise a width of 1.8 μm to 40 μm, for example, in the breaking direction 10. The side faces of the ribs 110 that extend parallel to the longitudinal direction 11 and to the growth direction 12 may be passivated, for example, with silicon nitride. A metallization may be arranged on the top side of the ribs 110 that is parallel to the breaking direction 10 and to the longitudinal direction 11, which metallization serves to electrically contact the laser chips 140 to be formed from the semiconductor wafer 100 and may have a thickness of approximately 1 μm, for example.

A respective mesa trench 120 extending in the longitudinal direction 11 is arranged between two ribs 110 located next to one another in the breaking direction 10 on the top side 101 of the semiconductor wafer 100. The mesa trenches 120 are formed as channel-shaped depressions on the top side 101 of the semiconductor wafer 100 and may extend in the opposite direction to the growth direction 12, for example, as far as below a pn junction of the semiconductor wafer 100. The mesa trenches 120 may comprise, for example, substantially rectangular cross sections. In the breaking direction 10, the mesa trenches 120 may comprise a width of approximately 50 μm, for example.

To subdivide the semiconductor wafer 100 into the individual laser chips 140, the semiconductor wafer 100 has to be divided at breaking planes 20 perpendicular to the longitudinal direction 11 and at further breaking planes 30 perpendicular to the breaking direction 10. In this case, the further breaking planes 30 run through the mesa trenches 120. Laser bars each comprising a plurality of laser diode structures 141 arranged alongside one another in the breaking direction 10 are formed by dividing the semiconductor wafer 100 at the breaking planes 20. The laser bars are subsequently divided at the further breaking planes 30 as a result of which the individual laser chips 140 are formed.

Mirror faces of resonators 142 of the individual laser diode structures 141 are formed by dividing the semiconductor wafer 100 at the breaking planes 20. To form high-quality mirror faces, the semiconductor wafer 100 is divided at the breaking planes 20 by breaking the semiconductor wafer. In this case, ideally atomically smooth fracture edges may be formed, which leads to high-quality mirror faces of the resonators 142.

The semiconductor wafer 100 is broken at the breaking planes 20 in each case in the breaking direction 10 from a side face of the semiconductor wafer 100 that is located at the front in the breaking direction 10 and is perpendicular to the breaking direction 10 to the side face of the semiconductor wafer 100 that is located at the rear in the breaking direction 10 and is perpendicular to the breaking direction 10. In the schematic illustration in FIG. 1, the semiconductor wafer 100 is thus broken, for example, from the visible front side face to the concealed rear side face of the semiconductor wafer 100.

The semiconductor wafer 100 is broken at the breaking planes 20 in each case proceeding from a predetermined breaking location created in a defined manner on the side face of the semiconductor wafer 100 that is located at the front in the breaking direction 10. To guide the progression of the break of the semiconductor wafer 100 at the respectively desired breaking plane 20, along the desired breaking planes 20 further weakenings are provided on the top side 101 of the semiconductor wafer 100.

FIG. 2 shows a schematic sectional side view of a part of the semiconductor wafer 100. In this case, the semiconductor wafer 100 is cut along one of the breaking planes 20. The desired breaking direction 10 for breaking the semiconductor wafer 100 at the breaking plane 20 extends from left to right in the schematic illustration in FIG. 2 such that a side face of the semiconductor wafer 100 that is on the left in the illustration in FIG. 2 forms a side face of the semiconductor wafer 100 that is located at the front in the breaking direction 10.

As a starting point for the break of the semiconductor wafer 100, an edge notch 170 has been created at a front edge 160 in the breaking direction 10 in the transition region between the side face of the semiconductor wafer 100 that is located at the front in the breaking direction 10 and the top side 101 of the semiconductor wafer 100. It is also possible to arrange the edge notch 170 in the transition region between the side face of the semiconductor wafer 100 that is located at the front in the breaking direction 10 and the underside 102 of the semiconductor wafer 100, or to extend the edge notch 170 over the entire front side face of the semiconductor wafer 100.

In addition, a edge notch may also be arranged on the side face of the semiconductor wafer 100 that is located at the rear in the breaking direction 10, but this is not absolutely necessary. In any case, the semiconductor wafer 100 is broken in the breaking direction 10 from the front side face to the rear side face of the semiconductor wafer 100.

To guide the break of the semiconductor wafer 100 at the breaking plane 20, the semiconductor wafer 100 additionally comprises on its top side 101 a plurality of first upper depressions 200 arranged along the breaking plane 20 one behind another in the breaking direction 10. The depressions 200 may also be referred to as skips.

The edge notches 170 and the first upper depressions 200 may be created, for example, by scribing, for example, using a diamond scriber or a laser.

Preferably, an edge notch 170 and first upper depressions 200 are provided, one behind another in the longitudinal direction 11, at each breaking plane 20.

Preferably, at each breaking plane 20 a respective first upper depression 200 is arranged between two laser diode structures succeeding one another in the breaking direction 10, hence between two ribs 110 succeeding one another in the breaking direction 10. In this case, each first upper depression 200 is preferably arranged in the region between the rib 110 of the laser diode structure 141 arranged upstream of the respective first upper depression 200 in the breaking direction 10 and the mesa trench 120 located between the two laser diode structures 141 adjacent to the respective first upper depression 200. Thus, each first upper depression 200 is arranged closer to the laser diode structure 141 located closest upstream of the respective first upper depression 200 in the breaking direction than to the laser diode structure 141 located closest downstream of the respective first upper depression 200 in the breaking direction 10. Preferably, in each first upper depression 200, a rear distance 245 between the respective first upper depression 200 and the laser diode structure 141 located closest downstream of the respective first upper depression 200 in the breaking direction 10 is at least four times the magnitude of a front distance 240 between the respective first upper depression 200 and the laser diode structure 141 located closest upstream of the respective first upper depression 200 in the breaking direction 10, particularly preferably even at least eight times the magnitude thereof. The front distance 240 between the resonator 142 of the laser diode structure 141 arranged upstream of a first upper depression 200 and the respective first upper depression 200 may be approximately 20 μm, for example. The rear distance 245 between a first upper depression 200 and the resonator 142 of the laser diode structure 141 closest in the breaking direction 10 downstream of the first upper depression 200 may be approximately 200 μm, for example.

It is also possible to provide more than one depression 200 between two laser diode structures succeeding one another in the breaking direction 10.

Each first upper depression 200 comprises a front boundary face 210 in the breaking direction 10 and a rear boundary face 220 in the breaking direction 10. The front boundary face 210 and the rear boundary face 220 of each first upper depression 200 are oriented parallel to the longitudinal direction 11 of the semiconductor wafer 100.

At its base, each first upper depression 200 comprises a bottom face 230 that connects the front boundary face 210 to the rear boundary face 220 and is oriented substantially parallel to the top side 101 of the semiconductor wafer 100, that is to say parallel to the breaking direction 10 and to the longitudinal direction 11.

In each first upper depression 200, the front boundary face 210 forms a front angle 212 with the bottom face 230. The front angle 212 is preferably 75° to 95°, particularly preferably 85° to 95°. This means that the front boundary face 210, proceeding from the top side 101 of the semiconductor wafer 100, extends preferably substantially perpendicularly into the semiconductor wafer 100.

In each first upper depression 200, the rear boundary face 220 in the breaking direction 10 forms a rear angle 221 with the bottom face 230. The rear angle 221 is 95° to 170°. This means that the rear boundary face 220 is inclined relative to the bottom face 230 and relative to the top side 101 of the semiconductor wafer 100. This has the consequence that each first upper depression 200 widens from its bottom face 230 toward the top side 101 of the semiconductor wafer 100. Preferably, the rear angle 221 in each first upper depression 200 comprises a magnitude of 100° to 160°, particularly preferably a magnitude of 120° to 145°.

Each first upper depression 200 comprises a depth 211 in the growth direction 12. Preferably, the depth 211 of each first upper depression 200 is 5 µm to 80 µm, particularly preferably 15 µm to 70 µm, very particularly preferably 25 µm to 55 µm.

The bottom face 230 of each first upper depression 200 comprise a length 231 in the breaking direction 10. Preferably, the length 231 in each first upper depression 200 is 5 µm to 100 µm, particularly preferably 15 µm to 80 µm, very particularly preferably 20 µm to 50 µm.

During breaking of the semiconductor wafer 100 in the breaking direction 10 at one of the breaking planes 20, crystal imperfections 150 may form on the first upper depressions 200, the crystal imperfections propagating in the semiconductor wafer 100. The crystal imperfections 150 may be stepped dislocations, for example. The occurrence of such crystal imperfections 150 during the break of the semiconductor wafer 100 at one of the breaking planes 20 may result in a reduced quality of the mirror faces formed by the break of the semiconductor wafer 100 at the breaking plane 20. For the quality of the resulting mirror faces of the resonators 142 of the laser chips 140 formed by breaking the semiconductor wafer 100 it is particularly detrimental if crystal imperfections 150 propagate in the semiconductor wafer 100 as far as an active region of one of the laser diode structures 141.

Crystal imperfections 150 that arise during the breaking of the semiconductor wafer 100 in the breaking direction 100 at one of the breaking planes 20 are formed primarily on the rear boundary faces 220 of the first upper depressions 200 and continue from there in a direction perpendicular to the rear boundary face 220. Since the rear boundary faces 220 of the first upper depressions 200 are inclined by the rear angle 221, which is greater than a right angle, relative to the top side 101 of the semiconductor wafer 100, the crystal imperfections 150 migrate from the rear boundary faces 220 of the first upper depressions 200 in the direction toward the underside 102 of the semiconductor wafer 100. This reduces the risk that crystal imperfections 150 formed at the rear boundary face 220 of a first upper depression 200 will continue in the breaking direction 10 as far as the active region of the laser diode structure 141 succeeding the respective first upper depression 200 in the breaking direction 10. This risk is additionally reduced by the rear distance 245 between the respective first upper depression 200 and the laser diode structure 141 located closest downstream of the respective first upper depression 200 in the breaking direction 10, the rear distance being increased relative to the front distance 240.

Preferably, all first upper depressions 200 (arranged one behind another in the breaking direction 10) of all breaking planes 20 arranged one behind another in the longitudinal direction 11 of the semiconductor wafer 10 are formed in the manner described. However, it is also possible for only a first portion of the first upper depressions 200 to be formed and positioned as described, while a second portion of the first upper depressions 200 is formed differently and/or positioned differently with regard to the front distance 240 and the rear distance 245.

FIG. 3 shows a schematic sectional side view of a part of the semiconductor wafer 100 in accordance with an alternative example. In the illustration in FIG. 3 as well, the semiconductor wafer 100 is cut along one of the breaking planes 20. The example in FIG. 3 differs from the example in FIG. 2 in that the first upper depressions 200 are replaced by second upper depressions 300.

The second upper depressions 300 are positioned like the first upper depressions 200. The second upper depressions 300 are formed like the first upper depressions 200, but has a shoulder 310 in addition to the front boundary face 210, the bottom face 230 and the rear boundary face 220, the shoulder being adjacent to the respective rear boundary face 220 at the rear end (in the breaking direction 10) of the respective second upper depression 300. The shoulder 310 of each second upper depression 300 comprises a shoulder face 320 parallel to the top side 101 of the semiconductor wafer 100 and adjacent to the respective rear boundary face 220. The shoulder face 320 comprises a length 321 in the breaking direction 10. Preferably, the length 321 of the shoulder face 320 of the shoulder 310 of the second upper depressions 300 is 5 µm to 100 µm, particularly preferably 15 µm to 80 µm, very particularly preferably 20 µm to 50 µm.

When breaking the semiconductor wafer 100 in the breaking direction 10 at one of the breaking planes 20, crystal imperfections 150 may also arise at the shoulder faces 320 of the shoulders 310 of the second upper depressions 300, the crystal imperfections, proceeding from the respective shoulder face 320, continuing into the semiconductor wafer 100 in a direction perpendicular to the respective shoulder face 320. Since the shoulder faces 320 of the shoulders 310 of the second upper depressions 300 are oriented parallel to the top side 101 of the semiconductor wafer 100, crystal imperfections 150 proceeding from the shoulder faces 320 of the shoulders 310 of the second upper depressions 300 continue substantially in the opposite direction to the growth direction 12 to the underside 102 of the semiconductor wafer 100. Thus, there is only a small risk that crystal imperfections 150 proceeding from the shoulder faces 320 may penetrate to active regions of the laser structures 141 of the semiconductor wafer 100.

In addition, crystal imperfections 150 proceeding from the shoulder faces 320 of the shoulders 310 of the second upper depressions 300 may meet crystal imperfections 150 which proceed from the rear boundary faces 220 of the second upper depressions 300 and continue in a direction oriented perpendicularly to the respective rear boundary face 220, and may thus intercept the crystal imperfections 150 proceeding from the rear boundary faces 220. As a result, crystal imperfections 150 proceeding from the shoulder faces 320 of the shoulders 310 of the second upper depressions 300 may reduce the risk that crystal imperfections 150 proceeding from the rear boundary faces 220 of the second upper depressions 300 will penetrate as far as active regions of the laser diode structures 141 of the semiconductor wafer 100.

In the schematic perspective illustration in FIG. 1 it is evident that a respective lower trench 130 extending in the breaking direction 10 and arranged in the respective breaking plane 20 is formed on the underside 102 of the semiconductor wafer 100 in the region of each breaking plane 20. The lower trenches 130 may facilitate the breaking of the semiconductor wafer 100 at the breaking planes 10. The lower trenches 130 may be created, for example, by sawing, a laser or wet- or dry-chemical etching. In this case, the lower trenches 130 are preferably already created before the upper depressions 200, 300 are created and before the edge notches 170 are created. However, the lower trenches 130 may also be omitted.

FIG. 4 shows a schematic sectional side view of a part of the semiconductor wafer 100 in accordance with a further alternative example. In the example shown in FIG. 4, the semiconductor wafer 100, on its underside 102, comprises no lower trenches 130 aligned with the breaking planes 20. Instead, lower depressions 400 aligned with the breaking planes 20 and arranged one behind another in the breaking direction 10 each are provided on the underside 102 of the semiconductor wafer 100.

In the example illustrated in FIG. 4, the lower depressions 400 are arranged and formed mirror-symmetrically with respect to the second upper depressions 300 arranged on the top side 101 of the semiconductor wafer 100. If the semiconductor wafer 100 comprises the first upper depressions 200 in FIG. 2 instead of the second upper depressions 300, the lower depressions 400 may be formed in a mirror-inverted fashion with respect to the first upper depressions 200. However, it is also possible to provide the first upper depressions 200 on the top side 101 of the semiconductor wafer 100, and to form the lower depressions 400 on the underside 102 of the semiconductor wafer 100 like the second upper depressions 300. The opposite case is also possible, of course.

In the illustration in FIG. 4, the lower depressions 400 are arranged in the opposite direction to the growth direction 12 in each case exactly below the second upper depressions 300. However, it is also possible to arrange the second upper depressions 300 and the lower depressions 400 in a manner offset relative to one another in the breaking direction 10. By way of example, the lower depressions 400 may be arranged in each case behind the assigned second upper depressions 300 in the breaking direction 10.

When breaking the semiconductor wafer 100 in the breaking direction 10 at one of the breaking planes 20, crystal imperfections 150 may also be formed at the rear boundary faces of the lower depressions 400. These crystal imperfections 150 formed at the rear boundary faces of the lower depressions 400 continue in the semiconductor wafer 100 in a direction perpendicular to the rear boundary face of the respective lower depression 400 and thus run in the direction toward the top side 101 of the semiconductor wafer 100. In this case, they may meet crystal imperfections 150 that proceed from rear boundary faces 220 of the opposite upper depressions 300. The meeting crystal imperfections 150 may mutually intercept one another and thus prevent the crystal imperfections 150 from continuing further in the semiconductor wafer 100. This reduces the risk that crystal imperfections 150 proceeding from the depressions 300, 400 will penetrate to active regions of the laser diode structures 141 of the semiconductor wafer 100.

Our methods have been illustrated and described in greater detail on the basis of the preferred examples. Nevertheless, this disclosure is not restricted to the examples disclosed. Rather, other variations may be derived therefrom by those skilled in the art, without departing from the scope of protection of the appended claims.

This application claims priority of DE 10 2014 112 902.4, the subject matter of which is hereby incorporated by reference.

The invention claimed is:

1. A method of producing a laser chip comprising:
   providing a semiconductor wafer comprising a top side and an underside,
   wherein the semiconductor wafer comprises a plurality of integrated laser diode structures arranged one behind another along a defined breaking direction;
   creating a plurality of depressions arranged one behind another along the breaking direction on the top side of the semiconductor wafer,
   wherein 1) each depression comprises a front boundary face and a rear boundary face successively in the breaking direction,
   2) in at least one depression, the rear boundary face is inclined by an angle of 95° to 170° relative to the top side of the semiconductor wafer,
   3) at least one depression comprises a shoulder adjacent to the rear boundary face, and
   4) the shoulder comprises a shoulder face parallel to the top side of the semiconductor wafer and adjacent to the rear boundary face;
   creating a trench running in the breaking direction and arranged in a breaking plane on the underside of the semiconductor wafer,
   wherein the breaking plane is oriented perpendicularly to the top side of the semiconductor wafer and runs through the depressions; and
   breaking the semiconductor wafer in the breaking direction at the breaking plane.

2. The method according to claim 1, wherein a respective depression is arranged between two adjacent laser diode structures.

3. The method according to claim 2, wherein at least one depression is arranged closer to a laser diode structure located closest upstream of the depression in the breaking direction than to a laser diode structure located closest downstream of the depression in the breaking direction.

4. The method according to claim 3, wherein a distance between the depression and the laser diode structure located closest downstream of the depression in the breaking direction is at least four times the magnitude of a distance between the depression and the laser diode structure located closest upstream of the depression in the breaking direction.

5. The method according to claim 1, wherein each of the laser diode structures comprises a resonator oriented perpendicularly to the breaking direction.

6. The method according to claim 1, wherein the depressions are created by scribing or a laser.

7. The method according to claim 1, further comprising:
creating an edge notch arranged in the breaking plane on an edge of the semiconductor wafer that is located at the front in the breaking direction.

8. The method according to claim 1, wherein the trench is created by sawing, a laser or an etching process.

9. The method according to claim 1, further comprising:
creating a plurality of depressions arranged one behind another in the breaking plane and along the breaking direction on the underside of the semiconductor wafer.

10. The method according to claim 9, wherein the depressions on the underside of the semiconductor wafer are formed in a mirror-inverted fashion with respect to the depressions on the top side of the semiconductor wafer.

11. The method according to claim 1, wherein, in at least one depression, the rear boundary face is inclined by an angle of 100° to 160° relative to the top side of the semiconductor wafer.

12. The method according to claim 1, wherein at least one depression comprises a depth of 5 µm to 80 µm in a direction perpendicularly to the top side of the semiconductor wafer.

13. The method according to claim 1, wherein, in at least one depression, the front boundary face is inclined by an angle of 75° to 95° relative to the top side of the semiconductor wafer.

14. The method according to claim 1, wherein at least one depression comprises a length of 5 µm to 100 µm at its base in the breaking direction.

15. The method according to claim 1, wherein the shoulder face comprises a length of 5 µm to 100 µm in the breaking direction.

* * * * *